(12) United States Patent
Shkel et al.

(10) Patent No.: US 9,429,428 B2
(45) Date of Patent: Aug. 30, 2016

(54) ENVIRONMENTALLY ROBUST MICRO-WINEGLASS GYROSCOPE

(71) Applicant: The Regents of the University of California, Oakland, CA (US)

(72) Inventors: Andrei Shkel, Irvine, CA (US); Doruk Senkal, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/843,844

(22) Filed: Sep. 2, 2015

(65) Prior Publication Data

US 2016/0047653 A1    Feb. 18, 2016

Related U.S. Application Data

(63) Continuation-in-part of application No. 13/838,132, filed on Mar. 15, 2013, now Pat. No. 9,139,417, which is a continuation-in-part of application No. 14/548,237, filed on Nov. 19, 2014.

(51) Int. Cl.
*G01C 19/00* (2013.01)
*G01C 19/5691* (2012.01)
*B81C 1/00* (2006.01)

(52) U.S. Cl.
CPC ....... *G01C 19/5691* (2013.01); *B81C 1/00238* (2013.01); *B81C 1/00634* (2013.01); *B81B 2201/0271* (2013.01)

(58) Field of Classification Search
CPC .................................................. G01C 19/5691
USPC .............. 73/503.3, 504.13, 504.14; 257/415; 438/50
See application file for complete search history.

(56) References Cited

U.S. PATENT DOCUMENTS

| | | | |
|---|---|---|---|
| 7,694,531 B2 * | 4/2010 | Eklund | C03B 23/02 264/41 |
| 8,490,485 B2 * | 7/2013 | Vandebeuque | G01C 19/5691 73/504.13 |
| 2011/0290021 A1 * | 12/2011 | Horning | G01C 19/5691 73/504.13 |

* cited by examiner

*Primary Examiner* — David Vu
*Assistant Examiner* — Brandon Fox
(74) *Attorney, Agent, or Firm* — Marcus C. Dawes; Daniel L. Dawes

(57) ABSTRACT

A method for fabricating an environmentally robust micro-wineglass gyroscope includes the steps of stacking and bonding of at least an inner glass layer and an outer glass layer to a substrate wafer; plastically deforming the inner glass layer into a mushroom-shaped structure and deforming the outer glass layer into a shield capable of extending over the inner glass layer, while leaving the inner and outer glass layers connectable at a central post location; removing the substrate layer and a portion of the inner glass layer so that a perimeter of the inner glass layer is free; and bonding the deformed inner and outer glass layers to a handle wafer. The resulting structure is an environmentally robust micro-wineglass gyroscope which has a double ended supported central post location for the mushroom-shaped structure of the inner glass layer.

22 Claims, 2 Drawing Sheets

ENVIRONMENTALLY ROBUST MICRO-WINEGLASS GYROSCOPE

RELATED CASES

The present application is a continuation in part of application Ser. No. 14/548,237, filed Nov. 19, 2014, and Ser. No. 13/838,132 filed Mar. 15, 2013, to which priority is claimed under 35 USC 120.

BACKGROUND

1. Field of Technology

The invention relates to the field of microfabricated gryoscopes with wineglass structures.

2. Description of the Prior Art

Micro-wineglass gyroscope architectures along with fabrication processes relying on micro-glassblowing were disclosed previously in U.S. patent application Ser. No. 14/548,237 and Ser. No. 13/838,132, both incorporated herein by reference. These gyroscope architectures has potential for very high performance due to structural symmetry, low internal dissipation due to highly pure fused silica material and self-aligned stem structure, structural rigidity due to three dimensional geometry. For this reason, micro-wineglass gyroscope architectures are being pursued by many groups. One of the key performance elements of the gyroscope is the self-aligned stem structure which decouples the vibratory element from the substrate, essentially providing anchor loss mitigation (low internal dissipation) and providing immunity to package stresses. However, as the stem structure being the only attachment point of the resonator to the package, it is the weakest point of the gyroscope. This Achilles Heel of the gyroscope is typically a source of large stress concentration and structural deformation in the presence of environmental vibrations and shock, greatly diminishing the vibration immunity of the gyroscope. In addition, in order to achieve the highest performance possible, micro-wineglass gyroscopes need to be operated in vacuum to mitigate the effects of viscous air damping and change in environmental conditions, such as temperature, humidity and pressure changes. This often requires a hermetically sealed package encompassing the gyroscope to shield the gyroscope away from environmental factors and the outside environment. Even though wafer-level sealing techniques for conventional two dimensional gyroscopes do exist, a co-fabricated packaging process for sealing three dimensional micro-wineglass gyroscopes has not been demonstrated yet.

There have been two main prior approaches: (1) micro-wineglass gyroscopes fabricated through deposition of thin films onto pre-defined molds and (2) micro-wineglass gyroscopes fabricated through plastic deformation of bulk materials.

Consider first surface micro-machined micro-wineglasss gyroscopes. Surface-micromachined micro-wineglass gyroscopes are almost exclusively fabricated by depositing a thin film onto a pre-defined mold with a sacrificial layer to create the resonator element. Due to the nature of thin film deposition processes, they typically exhibit a small size (<1-2 mm diameter) and thin structures (<5 μm thickness).

Isotropic wet etching of silicon molds using HF—HNO$_3$ and silicon nitride molds have been investigated at Cornell University, with the goal of depositing a thin film material (i.e., silicon nitride) into the mold at a later step to create hemispherical shell structures. Authors experimented with different HF and HNO$_3$ ratios as well as different silicon orientations, <100> and <111> wafers. The mold isotropy was analyzed using optical profilometry. The level of anisotropy was measured using optical profilometry, due to the crystalline nature of silicon the hemispherical molds were deformed towards a square shape for <100> silicon and towards a hexagonal shape for <111> silicon. Lowest measured anisotropy of 1.4% was obtained for <111> silicon wafers using higher HF:HNO$_3$ ratios. The process was later used to fabricate opto-mechanical light transducers.

Hemispherical shell structures were fabricated at Georgia Institute of Technology by isotropically etching silicon cavities, thermally growing SiO$_2$ inside and later removing the silicon mold using XeF$_2$ etching. As opposed to wet etching, the molds were created using a dry etching process (SF6 plasma etching). A radial deviation of 3.37 μm along the perimeter at a diameter of 1105 μm was reported. Hemispherical shell structures were subsequently coated with TiN using atomic layer deposition (ALD) for electrical conductivity. Electrostatic testing revealed a resonant mode with a Q-factor of about 6000 at 113 kHz. Similar structures were also fabricated out of polysilicon with integrated electrostatic transducers by using the SiO$_2$ layer inside the mold cavity as a sacrificial layer and depositing polysilicon on top to create the device layer. A Q-factor of about 8,000 was observed at 421 kHz for these structures. Fabrication effect of thickness anisotropy on oxide micro-hemispherical shell resonators was analyzed using finite element analysis (FEA). Experimental results showed a frequency split (Δf) of about 94 Hz, the thickness anisotropy was associated to different oxide growth rates at different crystalline planes of the silicon wafer.

Poly-crystalline diamond hemispherical shell structures were fabricated at University of California, Davis by depositing poly-diamond thin films into hemispherical molds on a silicon wafer. Primary advantages of polycrystaline diamond films are potentially high Q-factor and potential for boron doping, creating inherently conductive shell structures, bypassing the need for an additional metal layer. Instead of wet/dry etching, the hemispherical molds were created by μ-EDM (electro-discharge machining), followed by HNA (HF, nitric acid, acetic acid) wet etching to smooth the mold surface. A piezo-electric shaker was used to excite the diamond hemispherical shell structures. Frequency sweeps using this method revealed a Q-factor of about 3,000 at 35 kHz. A frequency split (Δf) of about 1 kHz was observed between two degenerate n=2 wineglass modes (5% relative split). The frequency split was associated with the roughness at the rim of the shell structures. Later, frequency splits (Δf) as low as 5 Hz were reported. Rate gyroscope operation was demonstrated. More recently, a DRIE etched cylindrical mold was used to create poly-diamond cylindrical resonators demonstrating Q-factors in excess of 300,000 and frequency splits as low as 3 Hz.

Another poly-diamond hemispherical resonator gyroscope was reported at Charles Stark Draper Laboratory. In this research, wet etching of Corning 1715 glass was used to achieve highly isotropic cavities compatible with temperatures required for poly-diamond deposition, while retaining a closer coefficient of expansion match (CTE) to the poly-diamond structure. Using this technique, average cavity diameters of 1288 μm were etched, with perfect roundness within the resolution of the measurement (±0.5 μm). Q-factors as high as 20,000 were reported on n=2 wineglass modes.

Another SiO$_2$ hemispherical shell fabrication process was reported by University of Utah, this process also relies on isotropically etched hemispherical molds on a silicon wafer.

Thermally grown $SiO_2$ was used as an etch stop layer along with a poly-silicon sacrificial layer underneath the oxide shells. Piezo-actuation and electrostatic drive using a probe tip were used for testing with laser Doppler vibrometry pick-off. Later electrostatic transduction and Q-factors above 10,000 at 22 kHz center frequency were reported.

In addition, thin film sputtered ULE (Ultra Low Expansion Glass) shells were reported using a process called 'Poached-Egg Micro-molding'. As opposed to using hemispherical molds on a silicon wafers, the authors utilized precision ball lenses as a mold. The ball lenses were coated with a poly-silicon sacrificial layer followed by sputtering of ULE glass as the device layer. The coated ball lenses were placed onto silicon posts and the ULE above the equator line of the lens was etched using Ar plasma etching. Subsequently the ball lens was removed by etching the ULE above the equator of the ball lens and $XeF_2$ of the poly-silicon device layer, leaving a sputtered ULE shell structure in the shape of the ball lens. Piezo shakers were used along with optical fiber pick-off for characterization. Q-factor of about 20,000 was observed at 17.3 kHz. Later, Silicon-on-Insulator (SOI) electrode structures were reported for electrostatic transduction.

All-dielectric ($SiO_2$) cylindrical gyroscopes were reported by HRL Laboratories. The main difference from cylindrical resonators is the $SiO_2$ resonator material. Transduction was achieved by using electric field gradients generated by interdigitated electrodes, eliminating the need for deposition of a conductive metal layer, which might potentially degrade the resonator performance. Q-factors as high as 12,000 were reported at 47.6 kHz center frequency using this technique.

Poly-crystalline diamond half-toroidal resonators were reported by Honeywell International. Resonators were fabricated by depositing poly-diamond onto micro-glassblown hemi-toroidal molds along with a polysilicon sacrificial layer. Frequency splits ($\Delta f$) as low as 2.4 Hz was reported on resonators with 2 mm diameter.

Extremely small (200 μm diameter) cenosphere-derived hemispherical shells were reported by University of Michigan. The shells are fabricated by ion-milling borosilicate glass cenospheres. For a sphere of 214 μm shell, quality factor of 130 was measured at 332.5 kHz.

Consider next bulk micro-machined micro-wineglasss gyroscopes. Next, we look at MEMS wineglass fabrication processes that rely on plastic deformation of bulk materials. A process based on ultrasonic machining (and EDM) is also considered.

Bulk metallic glass (BMG) spherical shells were fabricated at Yale University using blow molding. Platinum based ($Pt_{57.5}Cu_{14.7}Ni_{5.3}P_{22.5}$) bulk metallic glass with a processing temperature of 275° C. was used for the shell structures. Inert gases were used during most of the processing steps, due to low oxidation stability. Primary advantages of BMGs are low processing temperatures compared to most glasses, as well as inherent conductivity of the material, eliminating the need for metallization. Frequency splits as low as 5 Hz at 13.8 kHz and Q-factors as high as 7,800 at 9.4 kHz were demonstrated using this process.

Fused silica blow torch molding was used to create bird-bath (hemi-toroidal) and hemispherical shell structures at University of Michigan. To create the fused silica shells, thin layers of fused silica pieces were individually pressed onto graphite fixtures and deformed one at a time using the heat from a blow torch. Shells structures were later lapped from the back side to release the devices around their perimeter. Finally, the shells were sputter coated with thin layer of Ti/Au for conductivity. Ring-down testing under vacuum showed Q-factors as high as about 1.2 million at 8.7 kHz center frequency. Relative frequency split ($\Delta f_{n=2}/f_{n=2}$) ranged between 0.24% and 4.49% with a mean value at around 1-1.5% (100-150 Hz). Better alignment between the blow-torch and the mold as well as better temperature uniformity were proposed as a means to reduce the frequency split. At a later study, fused silica rods were embedded into the fused silica shell to create stem structures, showing Q-factors as high as 2.55 million at 22.6 kHz center frequency on uncoated resonators. Shells were later assembled into silicon-on-insulator (SOI) electrode structures to demonstrate rate gyroscope operation, showing angle random walk of $0:106°/\sqrt{h}$ and bias stability of 1°/h. In addition, a micro-machining process that utilizes ultrasonic machining (USM), electro-discharge machining (EDM), and lapping was proposed (3D-SOULE) to create micro-wineglass structures. EDM was mainly used to shape the stainless steel tooling, which was then used to USM fused silica spheres. Fused silica spherical-concave and mushroom type structures were created using this process. Laser Doppler Vibrometry was used to characterize the micro-wineglass structures, showing a Q-factor of 345 at 1.38 MHz in air.

BRIEF SUMMARY

What is disclosed is a method for fabricating double-ended stem structures along with a co-fabricated hermetic package for micro-glassblown wineglass gyroscopes. The method relies on micro-glassblowing to build a shield around the micro-glassblown wineglass structure to support the stem structure from two points (double ended clamped-clamped configuration) and to create a hermetic package around the micro-wineglass in one step. This double ended stem architecture greatly increases rigidity at fracture strength of the gyroscope enabling shock survival in the presence of accelerations in excess of 50,000 g. The shield can further be instrumented with co-fabricated heaters for temperature stabilization and electrodes for in-situ electrostatic transduction.

The disclosed architecture has the following advantages:
a. Orders of magnitude higher structural rigidity and robustness to shock induced fracture at the attachment point
b. Greater vibration rejection during operation (especially along z-axis)
c. Co-fabricated hermetic package for low cost wafer-level fabrication of micro-wineglass gyroscopes
d. A vibration-hardened gyroscope that can withstand g-forces in excess of 50,000 g The illustrated embodiments of the invention include a method for fabricating an environmentally robust micro-wineglass gyroscope including the steps of stacking and bonding of at least an inner glass layer and an outer glass layer to a substrate wafer; plastically deforming the inner glass layer into a mushroom-shaped structure and deforming the outer glass layer into a shield capable of extending over the inner glass layer, while leaving the inner and outer glass layers connectable at a central post location; removing the substrate layer and a portion of the inner glass layer so that a perimeter of the inner glass layer is free; and bonding the deformed inner and outer glass layers to a handle wafer.

The step of bonding the deformed inner and outer glass layers to a handle wafer includes directly bonding the mushroom-shaped structure of the inner glass layer to the handle wafer only at the central post location of the mushroom structure of the inner glass layer.

The step of bonding the deformed inner and outer glass layers to a handle wafer includes indirectly bonding the mushroom-shaped structure of the inner glass layer to the handle wafer through the shield of the deformed outer glass layer which is bonded to the handle wafer around a periphery of the shield. Where the central post location is also bonded to the handle wafer as well as the periphery of the shield of the outer glass layer then a double ended support for the mushroom-shaped structure with environmental robustness is created.

The step of bonding the deformed inner and outer glass layers to a handle wafer includes bonding the outer glass layer to the handle wafer at a perimeter of the outer glass layer to create a hermetic seal around the mushroom geometry of the inner glass layer.

In one embodiment the step of bonding the deformed inner and outer glass layers to a handle wafer includes bonding the outer glass layer to the handle wafer at a perimeter of the outer glass layer to simultaneously create a hermetic seal around the mushroom geometry of the inner glass layer with creation of a double ended support for the mushroom-shaped structure with environmental robustness.

In another embodiment the step of bonding the deformed inner and outer glass layers to a handle wafer includes bonding the outer glass layer only at the central post location, leaving a perimeter of the outer glass layer free and allowing for a second micro-wineglass gyroscope around the first mushroom-shape structure.

The step of plastically deforming the inner and outer glass layers includes plastically deforming the outer glass layer separately from plastically deforming the inner glass layer, and then assembling the deformed outer glass layer onto the deformed inner glass layer.

In another embodiment the step of plastically deforming the inner and outer glass layers includes plastically deforming the outer glass layer simultaneously with plastically deforming the inner glass layer, and simultaneously connecting the deformed outer glass layer to the deformed inner glass layer at the central post location.

The method further includes forming conductive traces either on the handle wafer or the shield of the outer glass layer for use in thermal stabilization of the gyroscope by resistive heating.

The method further includes metalizing the mushroom-shaped structure of the inner glass layer and metalizing the shield of the outer glass layer to form a capacitive gap therebetween for electrostatic transduction.

Prior to plastically deforming the inner glass layer into a mushroom-shaped structure and deforming the outer glass layer into a shield capable of extending over the inner glass layer, the method may further include disposing a sacrificial layer between the inner and outer glass layers, then plastically deforming the inner and outer glass layers, and removing the sacrificial layer to define a capacitive gap between the inner and outer glass layers.

The method further includes providing the substrate wafer with a pre-etched cavity in the substrate wafer disposed underneath the inner and outer glass layers to create a pressure differential for plastic deformation.

The method further includes providing the handle wafer with metal traces used for out-of-plane electrostatic transduction with the mushroom-shaped structure of the inner glass layer.

The step of providing the handle wafer with metal traces used for out-of-plane electrostatic transduction with the mushroom-shaped structure of the inner glass layer includes providing the metal traces defined as a group of 8, 12, 16, 24, 32 or 64 discrete electrodes.

The step of providing the handle wafer with metal traces used for out-of-plane electrostatic transduction with the mushroom-shaped structure of the inner glass layer includes providing a ring-shaped electrode.

The method further includes providing a handle wafer containing a pre-fabricated multi-layer application-specific integrated circuit (ASIC) for electronic amplification and control of a gyroscope signal.

The illustrated embodiments of the invention further include an environmentally robust micro-wineglass gyroscope which includes an inner glass layer forming a mushroom-shaped structure having a free perimeter; at least one shell electrode disposed on the mushroom-shaped structure; an outer glass layer forming a shield extending over the inner glass layer having a periphery while leaving the inner and outer glass layers connected together at a central post location; and a handle wafer bonded only to the central post location of the mushroom-shaped structure formed by the inner glass layer and bonded to the periphery of the shield formed by the outer glass layer, the handle wafer having at least one wafer electrode for electrostatic coupling with the at least one shell electrode, whereby a double ended supported central post location is created to the mushroom-shaped structure of the inner glass layer to provide an environmentally robust gyroscope.

The periphery of the outer glass layer includes a hermetic seal around the mushroom geometry of the inner glass layer.

The handle wafer includes metal traces defined as a group of 8, 12, 16, 24, 32 or 64 discrete electrodes in a ring electrode assembly used for out-of-plane electrostatic transduction with the mushroom-shaped structure of the inner glass layer.

The handle wafer includes a pre-fabricated multi-layer application-specific integrated circuit (ASIC) coupled to the at least one wafer electrode for electronic amplification and control of a gyroscope signal.

The illustrated embodiments also include a micro-wineglass gyroscope which includes an inner glass layer forming a mushroom-shaped structure having a free perimeter; at least one inner shell electrode disposed on the mushroom-shaped structure; an outer glass layer forming a shield extending over the inner glass layer having a free periphery while leaving the inner and outer glass layers connected together at a central post location; at least one outer shell electrode disposed on the mushroom-shaped structure; and a handle wafer bonded only to the central post location of the mushroom-shaped structure formed by the inner glass layer, the handle wafer having at least one wafer electrode for electrostatic coupling with the at least one inner and/or outer shell electrodes.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The disclosure can be better visualized by turning now to the following drawings wherein like elements are referenced by like numerals.

BRIEF DESCRIPTION OF THE DRAWINGS

FIG. 1a is a diagrammatic side cross sectional view of the method of manufacture of one embodiment of the invention after a cap wafer and a substrate wafer have been bonded to a device wafer to form a wafer stack.

FIG. 1b is a diagrammatic side cross sectional view of the method of manufacture of the invention after micro-glassblowing the wafer stack seen in FIG. 1a.

FIG. 1c is a diagrammatic side cross sectional view of the method of manufacture of the invention after the wafer stack seen in FIG. 1b has been embedded in a wax layer.

FIG. 1d is a diagrammatic side cross sectional view of the method of manufacture of the invention after the substrate wafer has been removed from the wafer stack seen in FIG. 1c.

FIG. 1e is a diagrammatic side cross sectional view of the method of manufacture of the invention after a handle wafer, electrodes, and a sacrificial layer of polysilicon have been bonded to the wafer stack seen in FIG. 1d.

FIG. 1f is a diagrammatic side cross sectional view of the method of manufacture of the invention after the sacrificial layer of polysilicon has been removed from the wafer stack seen in FIG. 1e.

The disclosure and its various embodiments can now be better understood by turning to the following detailed description of the preferred embodiments which are presented as illustrated examples of the embodiments defined in the claims. It is expressly understood that the embodiments as defined by the claims may be broader than the illustrated embodiments described below.

DETAILED DESCRIPTION OF THE PREFERRED EMBODIMENTS

Figure 1:
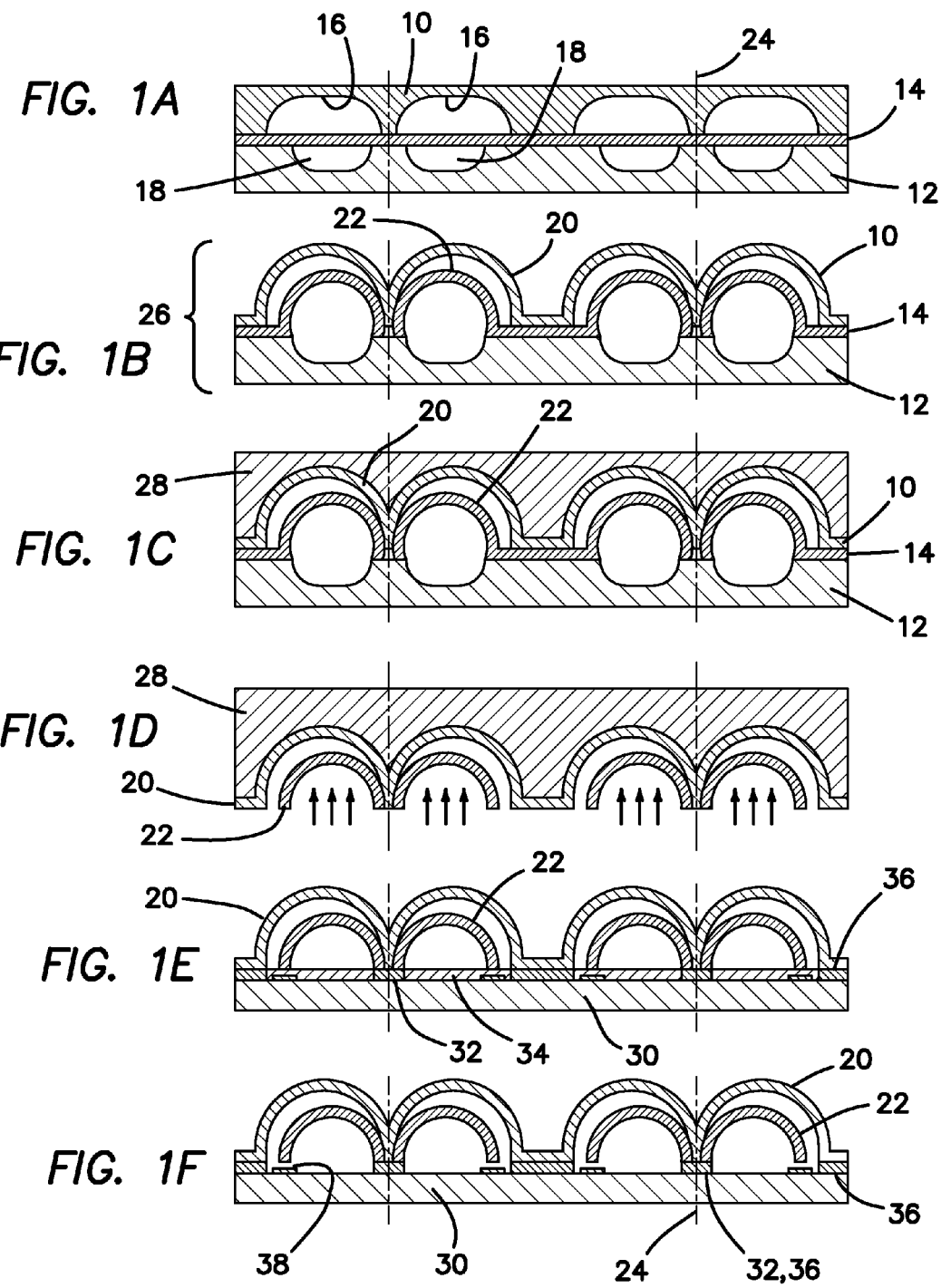

Process flow of the illustrated embodiments starts as diagrammatically depicted in FIG. 1a by etching two wafers, one cap wafer 10 and one substrate wafer 12 of fused silica, and both bonding to a third device wafer 14 of fused silica between the cap wafer 10 and substrate wafer 12. Cap wafer 10 has a plurality of pairs of cavities 16 defined therein and substrate wafer 12 has a plurality of pairs of cavities 18 defined therein. Cavities 16 and 18 are defined into wafers 10 and 12 by micromachining or any other conventional means. The centers of cavities 16 and 18 are offset from each other with the centers of cavities 18 in substrate wafer 12 being closer set to each other than the centers of cavities 16 in cap wafer 10. At the junction of wafer 10 between two adjacent cavities 16 and the junction of wafer 12 between two adjacent cavities 18 there is column vertical axis of material of wafers 10 and 12 which shall become the central post 24 between two adjacent resonant shells.

The step of FIG. 1a is followed by micro-glassblowing at an elevated temperature (1700° C. for fused silica) depicted in FIG. 1b. This results in pairs of hemispherical domes or shells 20 being formed in cap wafer 10 and included hemispherical domes or shells 22 being formed in device wafer 14. There is no dome or shell created in substrate 12 because of the difference in thicknesses of substrate layer 12 compared to layers 10 and 14, due to the heat being provided above layer 10 and due to the thermal coupling of substrate layer 12 in the oven to a thick metal boat on with it is placed. Because of the offset of the centers of cavities, the wafers 10 and 14 being plastic at the glassblowing temperature and the substrate 12 not. Shells 22 are nested inside of shells 20 in an asymmetric radial geometry, leaving a wider circumferential gap between peripheries of shells 20 and 22 while shells 20 and 22 are contiguous or nearly contiguous with each other near the central post 24. Wafers 10, 12 and 14 at this point comprise a defined wafer stack 26.

Wafer stack 26 is then embedded in a wax layer 28 to protect it against fracture as shown in FIG. 1c. Once the wafer stack 26 is embedded in wax 28, a backlapping process is used to remove the substrate wafer 12 and release the micro-wineglass structure 20, 22 as shown in FIG. 1d. Interior surfaces of the micro-wineglass 20, 22 are metallized for electrically conductivity as shown in FIG. 1d. Metallization can be done using sputtering, evaporation or atomic layer deposition (ALD). A shadow mask can also be used during the deposition process to pattern the metal layer.

The modified wafer stack 26 is then bonded to a prepared second or handle wafer 30 with a basal layer of semiconductor silicon with flat metal electrodes 32 and a sacrificial layer 34 of polysilicon on top of stack 30 as shown in FIG. 1e and protective layer of wax 28 removed. Metal electrodes 32 include those intended to form part of the capacitive drive elements as well as conductive bonding to metallization within shells 20 and 22. In the case of the electrode 32 at the central location of axis 24 it may also serve as an anchor 36 to wafer 30. Bonding by means of heating or other conventional means occurs at the anchor points 36 to attach the micro-wineglass gyroscopes to the electrode wafer 30 and at the perimeter of the outer shield provided by shells 20 to create a hermetic seal. Once the sacrificial layer 34 is removed in FIG. 1f by means of a wet or dry preferential etchant, out-of-plane capacitive gaps 38 are created for electrostatic transduction. Sealable channels (not shown) may be defined in wafer 30 communicating with cavities 16 defined by the interior of shell 20 by which etchant or other means may be introduced for the selective removal of sacrificial layer 34 or outgassing of cavities 16 as well as evacuating cavities 16 after shells 20 have been hermetically sealed to wafer 30 to allow for operation of the fabricated devices in partial vacuums.

It may now be appreciated by viewing FIG. 1f that what results is a doubled ended support of central support 24 at the center of the mushroom wineglass structure comprised of shell 22 and other components described above. At the same time a protective hermetically sealing covering shell 20 is provided in a single manufacturing step. As combined anchor 36 and electrode 32 is bonded to the bottom end of central post 24 as seen in FIG. 1f where the mushroom shape of shell 22 comes together, it must be remembered that the opposing or upper end of central post 24 as seen in FIG. 1f is integrally connected to the similar center of the mushroom shape of shell 20 comes together. As anchor 36 and electrode 32 is being bonded to wafer 30, the periphery of protective shell 20 is being simultaneously bonded at anchor 36 to wafer 30 around its periphery. Shell 30 thus serves as a toroidal arch which structurally also anchors the upper end of central post 24. Central post 24 is thus simultaneously supported or stabilized at its upper end as seen in FIG. 1*f* by fixed connection of mushroom shell 20 to wafer 30 around its periphery and supported or stabilized at its lower end as seen in FIG. 1*f* by fixed connection of mushroom shell 22 to wafer 30 at its center. This double ended support for central post 24 results in unexpected and substantially enhanced environmental robustness of the wineglass gyroscope.

Figures 2, 4:
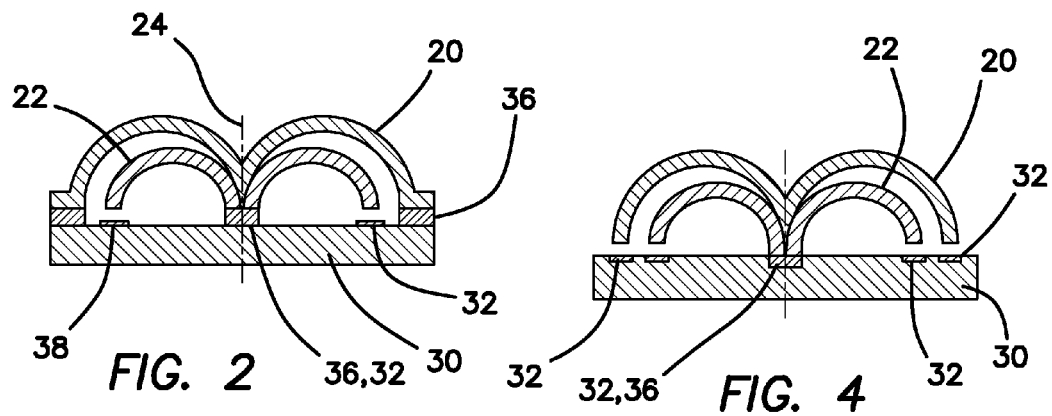
FIG. 2 is a diagrammatic side cross sectional view of another embodiment of the invention showing a finished gyroscope in which metallization is provided on or in both the inner and outer shells.
FIG. 4 is diagrammatic side cross sectional view of another embodiment of the invention showing a double shell gyroscope where the outer shell is not bonded to the handle wafer.

In addition to the process flow outlined above, additional an additional metal layer 40 can be deposited onto the outer shield provided by shells 20 (either before wafer bonding or after lapping), which can then be used to create in-plane-electrodes for additional electrostatic transduction as shown in the finished device of FIG. 2.

Figure 3:
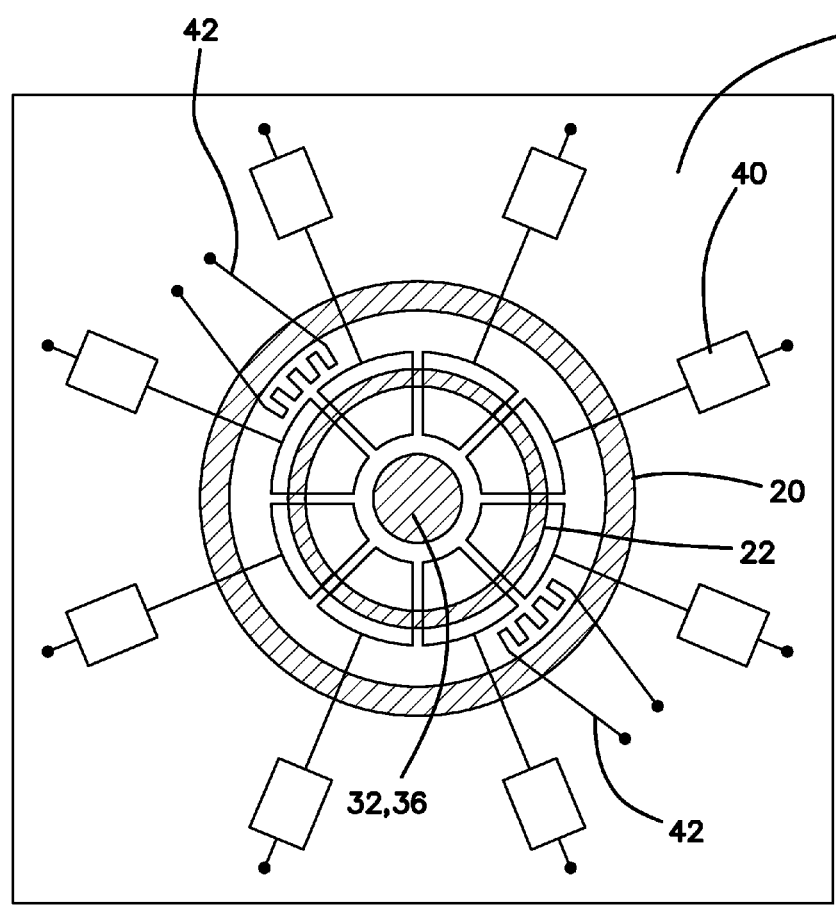
FIG. 3 is a diagrammatic plan view of a completed device in an embodiment wherein an ASIC circuit is included in the handle wafer.

FIG. 3 is a plan view of handle wafer 30 on which a completed embodiment of the gyroscope is fabricated in combination with an ASIC circuit 40 prefabricated into handle wafer 30 by conventional means. ASIC 40 is coupled to selected electrodes included in the gyroscope by which selected gyroscopic signals are amplified, controlled or process by ASIC on the handle wafer 30 on which the gyroscope is formed. FIG. 3 also shows metal traces 42 on shells 20 and/or 22 by which heating is selected supplied to the shells for purpose of thermal stabilization according to well understood principles.

FIG. 4 is a diagrammatic side cross sectional view of a completed device in which the periphery of the shield provided by outer glass layer 20 is not bonded to handle layer 30, which is instead provided with electrodes 32 coupled to shell 20 so that a double shell gyroscope including two nested resonant shells 20 and 22 are provided.

Many alterations and modifications may be made by those having ordinary skill in the art without departing from the spirit and scope of the embodiments. Therefore, it must be understood that the illustrated embodiment has been set forth only for the purposes of example and that it should not be taken as limiting the embodiments as defined by the following embodiments and its various embodiments.

Therefore, it must be understood that the illustrated embodiment has been set forth only for the purposes of example and that it should not be taken as limiting the embodiments as defined by the following claims. For example, notwithstanding the fact that the elements of a claim are set forth below in a certain combination, it must be expressly understood that the embodiments includes other combinations of fewer, more or different elements, which are disclosed in above even when not initially claimed in such combinations. A teaching that two elements are combined in a claimed combination is further to be understood as also allowing for a claimed combination in which the two elements are not combined with each other, but may be used alone or combined in other combinations. The excision of any disclosed element of the embodiments is explicitly contemplated as within the scope of the embodiments.

The words used in this specification to describe the various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the embodiments.

We claim:

1. A method for fabricating an environmentally robust micro-wineglass gyroscope comprising:
    stacking and bonding of at least an inner glass layer and an outer glass layer to a substrate wafer;
    plastically deforming the inner glass layer into a mushroom-shaped structure and deforming the outer glass layer into a shield capable of extending over the inner glass layer, while leaving the inner and outer glass layers connectable at a central post location;
    removing the substrate layer and a portion of the inner glass layer so that a perimeter of the inner glass layer is free; and
    bonding the deformed inner and outer glass layers to a handle wafer.

2. The method of claim 1, where bonding the deformed inner and outer glass layers to a handle wafer comprises directly bonding the mushroom-shaped structure of the inner glass layer to the handle wafer only at the central post location of the mushroom structure of the inner glass layer.

3. The method of claim 1, where bonding the deformed inner and outer glass layers to a handle wafer comprises indirectly bonding the mushroom-shaped structure of the inner glass layer to the handle wafer through the shield of the deformed outer glass layer which is bonded to the handle wafer around a periphery of the shield.

4. The method of claim 2, where bonding the deformed inner and outer glass layers to a handle wafer comprises indirectly bonding the mushroom-shaped structure of the inner glass layer to the handle wafer through the shield of the deformed outer glass layer which is bonded to the handle wafer around a periphery of the shield, creating a double ended support for the mushroom-shaped structure with environmental robustness.

5. The method of claim 1, where bonding the deformed inner and outer glass layers to a handle wafer comprises bonding the outer glass layer to the handle wafer at a perimeter of the outer glass layer to create a hermetic seal around the mushroom geometry of the inner glass layer.

6. The method of claim 2, where bonding the deformed inner and outer glass layers to a handle wafer comprises bonding the outer glass layer to the handle wafer at a perimeter of the outer glass layer to simultaneously create a hermetic seal around the mushroom geometry of the inner glass layer with creation of a double ended support for the mushroom-shaped structure with environmental robustness.

7. The method of claim 1, where bonding the deformed inner and outer glass layers to a handle wafer comprises bonding the outer glass layer only at the central post location, leaving a perimeter of the outer glass layer free and allowing for a second micro-wineglass gyroscope around the first mushroom-shape structure.

8. The method of claim 1, where plastically deforming the inner and outer glass layers comprises plastically deforming the outer glass layer separately from plastically deforming the inner glass layer, and then assembling the deformed outer glass layer onto the deformed inner glass layer.

9. The method of claim 1, where plastically deforming the inner and outer glass layers comprises plastically deforming the outer glass layer simultaneously with plastically deforming the inner glass layer, and simultaneously connecting the deformed outer glass layer to the deformed inner glass layer at the central post location.

10. The method of claim 1, further comprising forming conductive traces either on the handle wafer or the shield of the outer glass layer for use in thermal stabilization of the gyroscope by resistive heating.

11. The method of claim 1, further comprising metalizing the mushroom-shaped structure of the inner glass layer and metalizing the shield of the outer glass layer to form a capacitive gap therebetween for electrostatic transduction.

12. The method of claim 11, where prior to plastically deforming the inner glass layer into a mushroom-shaped structure and deforming the outer glass layer into a shield capable of extending over the inner glass layer, further comprising disposing a sacrificial layer between the inner and outer glass layers, then plastically deforming the inner and outer glass layers, and removing the sacrificial layer to define a capacitive gap between the inner and outer glass layers.

13. The method of claim 1, further comprising providing the substrate wafer with a pre-etched cavity in the substrate wafer disposed underneath the inner and outer glass layers to create a pressure differential for plastic deformation.

14. The method of claim 1, further comprising providing the handle wafer with metal traces used for out-of-plane electrostatic transduction with the mushroom-shaped structure of the inner glass layer.

15. The method of claim 14, where providing the handle wafer with metal traces used for out-of-plane electrostatic transduction with the mushroom-shaped structure of the inner glass layer comprises providing the metal traces defined as a group of 8, 12, 16, 24, 32 or 64 discrete electrodes.

16. The method of claim 14, where providing the handle wafer with metal traces used for out-of-plane electrostatic transduction with the mushroom-shaped structure of the inner glass layer comprises providing a ring-shaped electrode.

17. The method of claim 14, further comprising providing the handle wafer with a pre-fabricated multi-layer application-specific integrated circuit (ASIC) for electronic amplification and control of a gyroscope signal.

18. An environmentally robust micro-wineglass gyroscope comprising:
an inner glass layer forming a mushroom-shaped structure having a free perimeter;
at least one shell electrode disposed on the mushroom-shaped structure;
an outer glass layer forming a shield extending over the inner glass layer having a periphery while leaving the inner and outer glass layers connected together at a central post location; and
a handle wafer bonded only to the central post location of the mushroom-shaped structure formed by the inner glass layer and bonded to the periphery of the shield formed by the outer glass layer, the handle wafer having at least one wafer electrode for electrostatic coupling with the at least one shell electrode,
whereby a double ended supported central post location is created fort the mushroom-shaped structure of the inner glass layer to provide an environmentally robust gyroscope.

19. The environmentally robust micro-wineglass gyroscope of claim 18, where the periphery of the outer glass layer comprises a hermetic seal around the mushroom geometry of the inner glass layer.

20. The environmentally robust micro-wineglass gyroscope of claim 18, where the handle wafer includes metal traces defined as a group of 8, 12, 16, 24, 32 or 64 discrete electrodes in a ring electrode assembly used for out-of-plane electrostatic transduction with the mushroom-shaped structure of the inner glass layer.

21. The environmentally robust micro-wineglass gyroscope of claim 18, wherein the handle wafer includes a pre-fabricated multi-layer application-specific integrated circuit (ASIC) coupled to the at least one wafer electrode for electronic amplification and control of a gyroscopic signal.

22. A micro-wineglass gyroscope comprising:
an inner glass layer forming a mushroom-shaped structure having a free perimeter;
at least one inner shell electrode disposed on the mushroom-shaped structure;
an outer glass layer forming a shield extending over the inner glass layer having a free periphery while leaving the inner and outer glass layers connected together at a central post location;
at least one outer shell electrode disposed on the mushroom-shaped structure; and
a handle wafer bonded only to the central post location of the mushroom-shaped structure formed by the inner glass layer, the handle wafer having at least one wafer electrode for electrostatic coupling with the at least one inner and/or outer shell electrodes.

* * * * *